United States Patent
Allan

[19]

[11] Patent Number: 5,973,552
[45] Date of Patent: Oct. 26, 1999

[54] POWER SAVINGS TECHNIQUE IN SOLID STATE INTEGRATED CIRCUITS

[75] Inventor: Graham Allan, Stittsville, Canada

[73] Assignee: Mosaid Technologies Incorporated, Kanata, Canada

[21] Appl. No.: 08/743,348

[22] Filed: Nov. 4, 1996

[51] Int. Cl.[6] .............................................. H03K 19/0948
[52] U.S. Cl. ......................... 327/544; 327/541; 365/227
[58] Field of Search ..................... 327/544, 546, 327/534–535, 537, 333; 326/33, 34; 365/226, 227

[56] References Cited

U.S. PATENT DOCUMENTS

| | | | |
|---|---|---|---|
| 5,245,230 | 9/1993 | Ohri et al. ............................... | 327/546 |
| 5,486,774 | 1/1996 | Douseki et al. .......................... | 326/33 |
| 5,614,847 | 3/1997 | Kawahara et al. ....................... | 327/544 |

FOREIGN PATENT DOCUMENTS 2-37823  2/1990  Japan ...................................... 327/333

*Primary Examiner*—Tuan T. Lam
*Attorney, Agent, or Firm*—Pascal & Associates

[57] ABSTRACT

A power saving circuit for metal oxide silicon field effect transistors (MOSFETS) comprised of an MOS circuit comprising low threshold voltage MOSFETs, at least one MOS FET switch connected in series between the low threshold MOSFET and a power rail, at least one MOSFET switch being of low threshold voltage type similar to MOSFETS used in the MOS circuit, and apparatus for applying at least one control signal to the at least one MOSFET switch for enabling the at least one MOSFET switch to turn on and off, the at least one control signal having a voltage of at least one of VPP and VBB, wherein VPP is more positive than a normal power rail operating voltage VDD, and VBB is more negative than a normal opposite power rail operating voltage VSS.

10 Claims, 3 Drawing Sheets

POWER SAVINGS TECHNIQUE IN SOLID STATE INTEGRATED CIRCUITS

FIELD OF THE INVENTION

This invention relates to a structure for operating metal oxide silicon field effect transistors (MOSFETs) from very low voltage and in particular to a structure for minimizing current leakage through MOSFETS during their off states.

BACKGROUND TO THE INVENTION

As integrated circuits (ICs) become more advanced, feature sizes are reduced to achieve higher performance and to place more circuits on a single chip. The smaller feature sizes make the ICs more sensitive to damage from voltage levels that are used. To reduce the likelihood of such damage occurring, operating voltage levels are being reduced, e.g. to 2 volts or less. Reduction in operating voltage also requires a similar reduction in threshold voltage ($V_T$) to keep noise margins and other operational factors in scale.

Unfortunately, as threshold voltages are reduced, the MOSFETS leak current at a higher rate than at the higher voltages when the MOSFETS are "off". This effect is caused by subthreshold current, which becomes more significant as threshold voltages are reduced.

Several different techniques have been used in the past to avoid the subthreshold leakage, most of which involve placing switches between the low $V_T$ MOS circuits and power supplies, to electrically isolate the MOS devices when they are off. A description of a prior art technique may be found in "Low Voltage Circuit Design Techniques for Battery-Operated and/or Giga-Scale DRAMs", by Tadato Yamagata et al, IEEE Journal of Solid-State Circuits, Vol. 30, No. Nov. 11, 1995, pp. 1183–1188.

A prior art circuit is shown in FIG. 1, wherein a low threshold ($V_T$) MOS circuit 1 is connected via switches 3 and 5 to power supply rails of VDD and ground (VSS). Signals applied to the switches 3 and 5 cause them to close for normal operation and open for low power standby operation. Assuming the switches to be perfect, leakage current through circuit 1 would be stopped when the switches are open.

However, the switches 3 and 5 are not perfect, as they are realized by MOSFETS 7 and 9 as shown in FIG. 2. The MOSFETS 7 and 9 have their source-drain circuits in series with circuit 1 to voltage rails VDD and ground, respectively. MOSFETS 7 and 9 are typically realized as PMOS (p-channel MOS) and NMOS (n-channel MOS) high $V_T$ FETs respectively, in order to have low subthreshold leakage currents, and therefore to function as an effective off switch to stop subthreshold current leakage through circuits 1. Low $V_T$ devices are used in circuits 1 in order to provide acceptable propagation delay during normal operation.

To operate the switches, a signal STBY is applied to FET 7, which when pulled to VSS causes FET 7 to operate for normal operation of circuit 1, and when pulled to VDD causes FET 7 to become nonconductive, during a low power standby mode of circuit 1.

A signal /STBY is applied to FET 9, which when pulled high to VDD causes FET 9 to operate for normal operation of circuit 1, and when pulled low to VSS causes FET 9 to become nonconductive, during the low power standby mode of circuit 1.

Thus the high $V_T$ devices controlled by the STBY and /STBY signals, having lower subthreshold leakage currents than the devices used in circuits 1, limit subthreshold leakage during standby. The FETs 7 and 9 controlled by the STBY and /STBY signals may be local to a small or to a large group or to groups of logic circuits, to suit the design.

However, the circuit shown in FIG. 2 requires more processing steps than is desirable. To fabricate both high and low $V_T$ NMOS and PMOS devices in the same integrated circuit, extra masks are required to isolate the high $V_T$ devices from the low $V_T$ devices and requires additional fabrication steps. This can reduce yield and increase manufacturing costs.

FIG. 3 illustrates a variation of the above circuit, in which only a single switch is used. The circuit 1 in this case is shown as a complementary symmetry MOS (CMOS) inverter 11 formed of a PMOS and an NMOS FET having their source drain circuits connected in series, one end thereof being connected to VDD. The gates of the CMOS FETs are connected together to an input IN and the junctions of their source and drain circuits forms the output OUT.

An NMOS FET 13, used as a switch, is connected between the other end of the source drain circuit of the inverter 11 and ground. A high valued resistor 15 is connected across the source and drain of FET 13.

In this example, OUT is known to be at high logic level during the time that the inverter 11 is in its standby state, and therefore no power switch is required in its pull-up path. Control signal /STBY is pulled low to disable FET 13 during the standby time. The subthreshold leakage current $I_{ST}$ through the off NMOS FET of inverter 11 is in this case shunted through the resistor 15 to ground. This current induces a voltage drop across the resistor which increases the voltage $V_S$ at the source of the NMOS FET of the inverter 11. The increase in $V_S$ decreases the gate to source voltage of the NMOS FET of inverter 11 and therefore acts to turn that FET off harder, and effectively reduces the subthreshold leakage current $I_{ST}$ through that FET.

While the circuit of FIG. 3 has the advantage that no nodes float during the standby time, since only the "off" pull up or pull down path is effected, a high $V_T$ device is still required for FET 13, with the attendant increased fabrication complexity, cost and yield risk described with reference to the structure of FIG. 2. In addition, the resistor is a large device in an integrated circuit, which consumes precious silicon area.

SUMMARY OF THE INVENTION

The present invention is a structure for limiting subthreshold leakage current in a low $V_T$ MOS circuit which can use MOSFET switches that are of the same low $V_T$ MOS types as in the low voltage MOS circuit itself. Accordingly, no special extra processing to fabricate both high and low $V_T$ NMOS and PMOS devices in the same integrated circuit, and no extra masking steps to isolate high $V_T$ devices from the low $V_T$ devices, are required.

Control signal or control signals are used to drive the low $V_T$ MOSFET switch or switches which are more positive than VDD and more negative than VSS, which drives the MOSFET switch or switches further into its or their cutoff region or regions as compared with driving the switches with the normal logic levels of VDD and VSS. This reduces the subthreshold current and resulting standby power of the low $V_T$ MOSFET switches, allowing them to be used, and thus allowing the same fabrication technology to be used for both the MOS circuits and MOS switches.

In accordance with an embodiment of the present invention, a power saving circuit for metal oxide silicon field effect transistors (MOSFETS) is comprised of an MOS, circuit comprising low threshold voltage MOSFETS, at least one MOS FET switch connected in series between the low threshold MOSFET and a power rail, the at least one MOSFET switch being of low threshold voltage type similar to MOSFETS used in the MOS circuit, and apparatus for applying at least one control signal to the at least one MOSFET switch for enabling the at least one MOSFET switch to turn on and off, the at least one control signal having a voltage of at least one of VPP and VBB, wherein VPP is more positive than a normal power rail operating voltage VDD, and VBB is more negative than a normal opposite power rail operating voltage VSS.

In accordance with another embodiment, a power saving circuit for limiting subthreshold leakage current in a low $V_T$ MOS circuit is comprised of at least one MOSFET Switch of a same low $V_T$ MOS type as in the low $V_T$ MOS circuit, connected between the low $V_T$ MOS circuit and at Least one power rail having an operating voltage of at least one of VDD and VSS, means for applying at a first time a control signal to the low $V_T$ MOSFET switch which is one of more positive than VDD and more negative than VSS, for driving the MOSFET switch further into its cutoff region than would be the case if the control signal were a normal logic level of one of VDD and VSS, and means for applying said control signal to the low $V_T$ MOSFET switch at a second time with a voltage of one of VSS and VDD.

BRIEF INTRODUCTION TO THE DRAWINGS

A better understanding of the invention will be obtained by considering the detailed description below, with reference to the following drawings, in which:

FIG. 1 is a diagram illustrating an ideal concept desired to be achieved in the prior art and in the present invention, FIGS. 2 and 3 are diagrams of two prior art circuits, FIG. 4 is a diagram of an embodiment of the present invention, FIG. 5 is a diagram of an embodiment of a level shifter circuit that can be used as part of the present invention, FIG. 6A illustrates a circuit for implementing a two-phase pull-up method, and FIG. 6B illustrates a timing chart for the circuit of FIG. 6A.

DETAILED DESCRIPTION OF PREFERRED EMBODIMENTS

Figure 1:
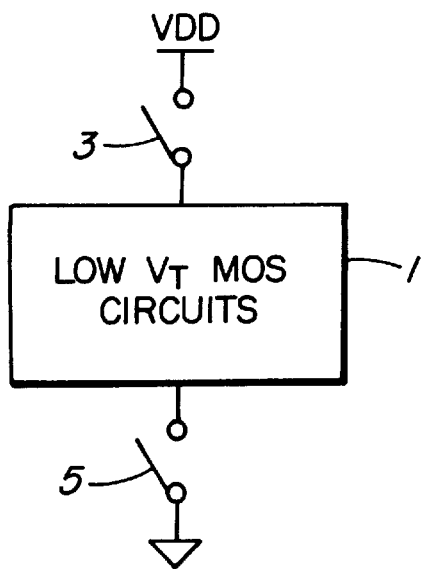
Figure 2:
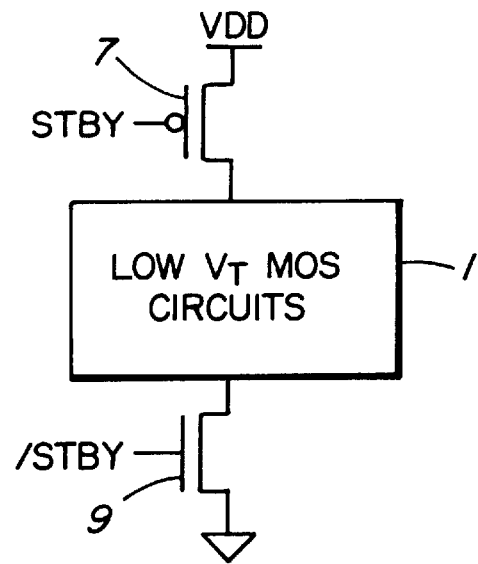
Figure 3:
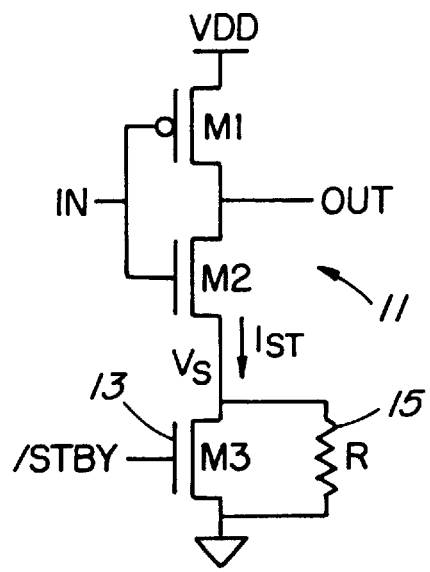
Figure 4:
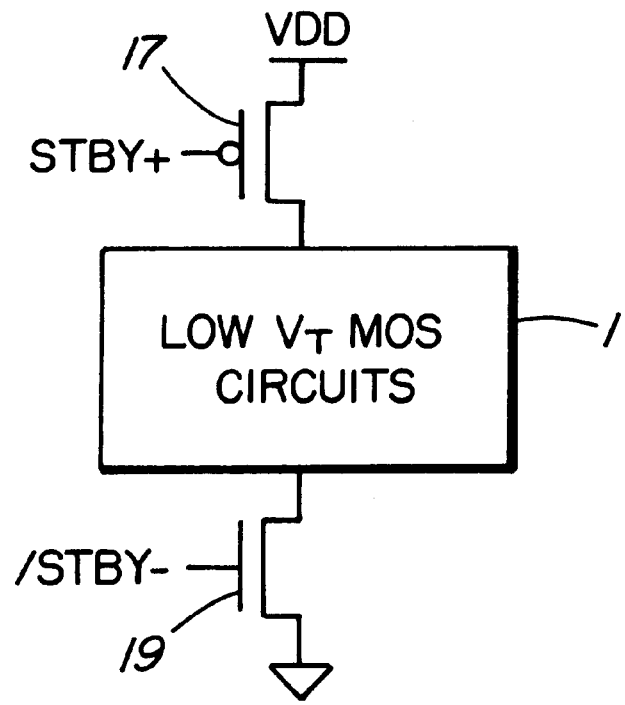

Turning now to FIG. 4, a low $V_T$ circuit 1 is shown, which can for example be an inverter such as inverter 11 shown in FIG. 3. As shown in FIG. 2, FET switches 17 and 19, shown as PMOS and NMOS CMOS conductivity types, are respectively connected between circuit 1 and normal voltage power rail VDD, and between circuit 1 and ground, which can be normal voltage power rail VSS.

However, switches 17 and 19 are low $V_T$ type FETs, similar to the ones which are used in circuit 1. This allows the entire circuit to use the same fabrication steps, without the requirement of using separate masks, isolation well, etc.

Instead of driving the switches with control signals STBY and /STBY of voltages VDD and VSS, control signals STBY+ and /STBY− are used.

The signal STBY+ pulls the gate of FET 17 low to the voltage VSS to cause FET 17 to operate, to allow normal operation of circuit 1. Similarly, the signal /STBY− pulls the gate of FET 19 high to the voltage VDD to cause FET 19 to operate, to allow normal operation of circuit 1.

However, during a standby time, the signal STBY+ pulls the gate of FET 17 to a voltage VPP which is higher than VDD, which causes FET 17 to cease conducting. Similarly, the signal /STBY− pulls the gate of FET 19 to VBB, wherein VBB is more negative than VSS, which causes the FET 19 to cease conducting.

During the standby time, the gate to source voltage $V_{GS}$ of FET 17 is VPP-VDD and $V_{GS}$ of FET NMOS FET 19 is VBB-VSS. This biases FETs 17 and 19 further into their cutoff region as compared with $V_{GS}=0$ (the best possible condition with conventional VSS and VDD STBY and /STBY signals). This reduces subthreshold current, which reduces standby power.

Typical values for VPP and VBB can be one $V_T$ or greater voltage more positive than VDD and one $V_T$ or greater voltage more negative than VBB.

The present invention can also be used in a circuit similar to FIG. 3, wherein in place of /STBY, a /STBY− signal is used, and wherein FET 13 is replaced by a low $V_T$ FET. /STBY is applied as either VDD or VBB as described above, to cause the switching FET to conduct or to be non-conductive.

The voltages VPP and VBB are often generated on or off chip for use by other circuits of a dynamic random access random access memory (DRAM), and thus can be supplied as control signals to the circuit of the present invention from voltage rails in DRAMs or other existing sources in DRAMs or other ICs.

Figure 5:
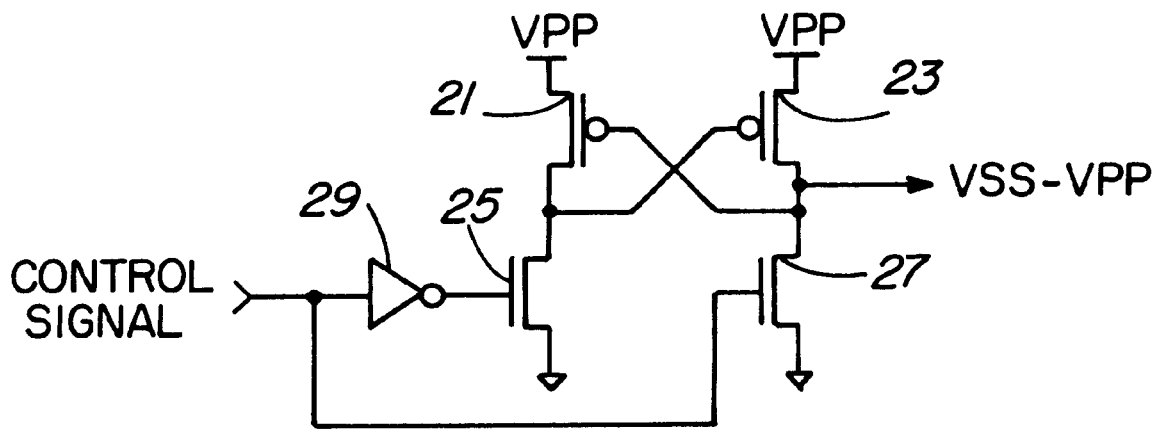

The control voltages could be supplied via a level shifter, for example as shown in FIG. 5, which supplies an output signal of either VSS or VPP, as will be described below.

A pair of crosscoupled PMOS FETs 21 and 23 are connected with their source-drain circuits in series with NMOS FETs 25 and 27 respectively between voltage source VPP and ground (VSS). A control signal for controlling the output voltage is applied to the input of an inverter 29, whose output is connected to the input of FET 25, and to the input of an inverter 27. The junction of FETs 23 and 27 is the output node, from which the control signal STBY+ is obtained, i.e. the range of STBY+ is VSS and VPP.

When the control signal is low logic level, the input voltage to the gate of FET 25 is high and the input voltage to the gate of FET 27 is low. FET 25 thus conduct; and FET 27 does not conduct. With FET 27 non-conductive, the gate of FET 21 is brought high, to VPP. With FET 25 conductive, the gate of FET 23 goes low, to VSS, and FET 23 becomes conductive. The result is that the output is at voltage VPP.

When the control signal is high logic level, the input voltage to FET 25 is low and the input voltage to FET 27 is high. FET 27 thus conducts and FET 25 does not conduct. With FET 27 conducting, the output is brought to VSS. The gate of FET 21 goes to VSS, causing it to conduct. This causes the gate of FET 23 to go high, causing it to not conduct.

It may thus be seen that the voltage at the output of the circuit can be controlled to vary between VSS and VPP by applying the appropriate control signal to the input of inverter 29. The circuit of FIG. 5 thus operates as a level shifter of an input signal which can vary between logic levels VSS and VDD, to VSS and VPP.

It should be noted that by using NMOS FETs in place of the PMOS FETs shown in FIG. 5, and by using PMOS FETs in place of NMOS FETs, and instead of connecting the circuit between voltage sources VPP and VSS the circuit is connected between VBB and VDD, a level shifter of an input signal can be made by which varies the output node between VDD and VBB.

By use of the latter circuit and the one originally described with reference to FIG. 5, by STBY+ and /STBY− signals can be provided, which can be used for control of a circuit such as described with reference to FIG. 4. By use of the latter circuit, control of a circuit such as described with reference to the modification of FIG. 3 described above can be obtained.

It should be noted that when the IC is put into a low power standby mode, there may be a large load representing all of the switching FETs as described above which need to be pulled up from VSS to VPP or pulled down from VDD to VBB. This may overwhelm on-chip power supplies, and thereby collapse the VPP and VBB voltage levels. To circumvent this problem, the pull-up to VPP could include two phases, wherein a first phase is a pull-up from VSS to VDD or to VDD less an increment, after which the VDD is disabled, and in which a second phase is a slow pull up from VDD or VDD less an increment to VPP. A similar approach can be taken with the pull-down to VBB, wherein in a first phase VDD is pulled down to VSS or VSS plus an increment, after which VSS pull-down is disabled and then in a second phase VSS is pulled down slowly from VSS or VSS plus an increment to VBB.

Figure 6A:
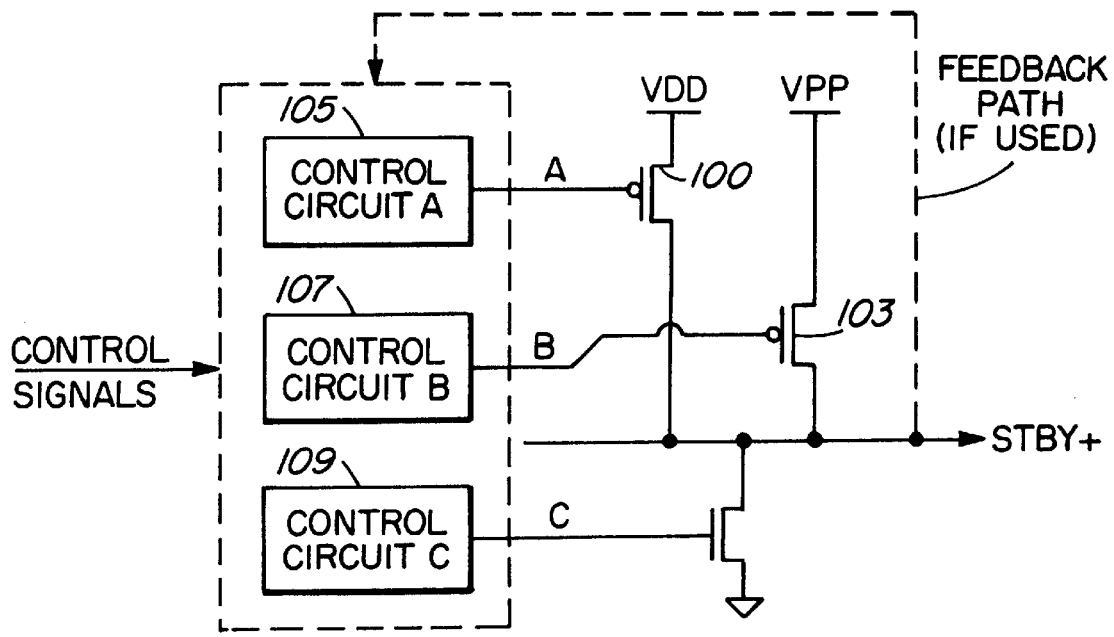
Figure 6B:
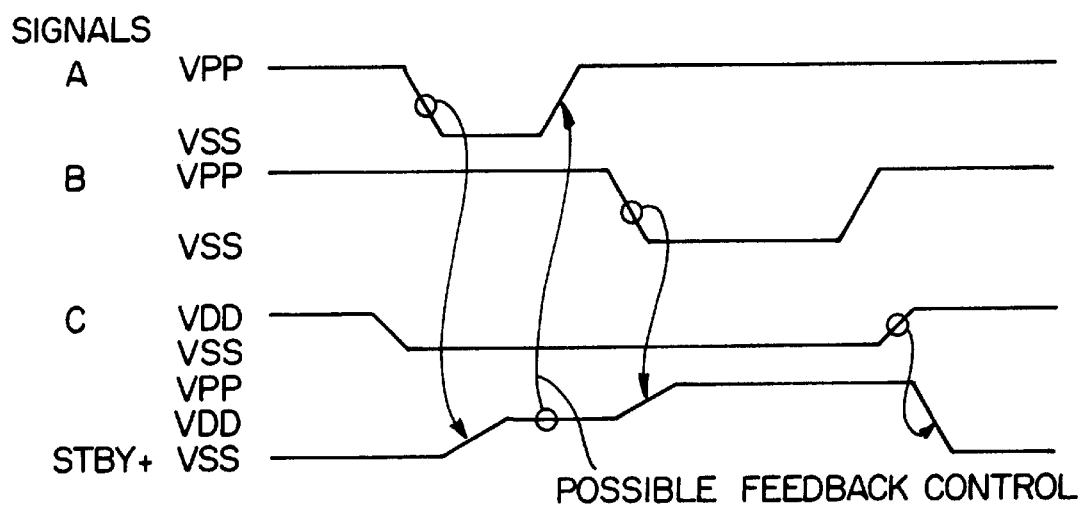

FIGS. 6A and 6B illustrate an example of a preferred embodiment of this two-phase pull-up method wherein FIG. 6A illustrates the circuit and FIG. 6B illustrates a timing circuit. Two pull-up paths for signal STBY+ exist, the source drain circuits of PMS FETs 100 and 103.

In operation, node A is activated first by a control signal from control circuit 105 applied to the gate of FIET 100, pulling STBY+ to VDD, after releasing STBY+ from ground through the source-drain circuit of NMOS FET 105 under control of control circuit 107. Then after a short duration/delay which can be implemented through a feed-back system or just a simple delay line, node A rises back to VPP and node B is brought to VSS by a control signal from control circuit 107 applied to the gate of FET 107, thus turning on the second pull-up path to VPP.

A similar system can be used for the VBB pull-down path by replacing the PMOS FETs 100 and 103 with NMOS FETs 10 and substitutive VPP with VBB and VDD with VSS.

It should be further noted that the VPP and VBB generators can themselves be put into a low power mode when not needed during standby conditions.

While the low $V_T$ MOS circuits described above have been described with reference to a CMOS inverter, they could be any MOS circuits with one or more logic gates or functions. The low $V_T$ switching FET or FETs could be connected in series as described above with such multi-gate or multi-inverter circuits, or with each MOS logic gate, and can be connected in series with either the pull-up or the pull-down path, or with both the pull-up and pull-down paths thereof, depending on the standby state of the output node. The invention can be used with any relevant integrated circuit application, and is particularly suitable for use in DRAMs, which often include on-chip VPP and VBB generators for use in the DRAMs.

A person understanding this invention may now conceive of alternative structures and embodiments or variations of the above. All those which fall within the scope of the claims appended hereto are considered to be part of the present invention.

I claim:

1. A power saving circuit for metal oxide silicon field effect transistors (MOSFETs) comprising:

(a) an MOS circuit comprising low threshold voltage MOSFETs having thresholds which are so low that said low threshold voltage MOSFETs can exhibit subthreshold current leakage, (b) at least one MOSFET switch connected in series between the low threshold voltage MOSFETs and a corresponding one of a pair of operating voltages VDD and Vss, said at least one MOSFET switch comprised of low threshold voltage type similar to MOSFETs used in the MOS circuit, (c) means for applying at least one control signal to the at least one MOSFET switch for disabling, during a standby mode operation of the at least one MOSFET switch, the at least one control signal having a voltage of at least one of VPP and VBB, wherein VPP is more positive than the operating voltage VDD, and VBB is more negative than the operating voltage VSS, (d) said at least one MOSFET switch being comprised of a pair of MOSFET switches, one of the pair of MOSFET switches being formed of a PMOSFET switch connected between said MOS circuit and the operating voltage VDD and another of the pair of MOSFET switches being formed of an NMOSFET switch connected between said MOS circuit and the operating voltage VSS, wherein during a single pull-up interval of the standby mode operation, the control signal is at the operating voltage VSS and being raised to the operating voltage VDD and being applied in a first phase, and the operating voltage VDD is further increased to the voltage VPP and being applied in a second phase following the first phase in a sequence, to a gate of said PMOSFET switch, both said first and second phases occurring in said single pull-up interval, and during a single pull-down interval of the standby mode operation, the control signal is at said operating voltage VDD being lowered to the operating voltage VSS and being applied in a third phase, and the operating voltage VSS is further decreased to the voltage VBB and being applied in a fourth phase following said third phase in a sequence, to a gate of said NMOSFET switch, both said third and fourth phases occurring in a single pull-down interval.

2. A circuit as defined in claim 1 in which the MOS circuit is comprised of a pair of CMOS FETs.

3. A circuit as defined in claim 1 in which the MOS circuit is contained in a dynamic random access memory (DRAM).

4. A circuit as defined in claim 1 in which the at least one control signal is provided from an existing voltage source of a chip containing said MOS circuit.

5. A power saving circuit for metal oxide silicon field effect transistors (MOSFETs) comprising:

(a) an MOS circuit comprising low threshold voltage MOSFETs having thresholds which are so low that said low threshold voltage MOSFETs can exhibit subthreshold current leakage, (b) at least one MOSFET switch connected in series between the low threshold voltage MOSFETs and a corresponding one of a pair of operating voltages VDD and VSS, said at least one MOSFET switch being of low threshold voltage type similar to MOSFETs used in the MOS circuit, (c) means for applying at least one control signal to the at least one MOSFET switch for disabling, during a standby mode operation of the at least one MOSFET switch, the at least one control signal having a voltage of at least one of VPP and VBB, wherein VPP is more positive than the operating voltage VDD, and VBB is more negative than a operating voltage VSS, (d) wherein said at least one MOSFET switch comprises a single MOSFET switch connected between said MOS circuit and the operating voltage VSS and a resistor connected across a source and drain of the MOSFET switch, (e) the MOS circuit being comprised of a pair of complementary MOS (CMOS) FETs forming an inverter, and in which the single MOSFET switch is connected between an NMOS FET of the pair of CMOS FETs and said operating voltage VSS, and (f) the single MOSFET switch being an NMOS switching FET, and wherein during pull-down interval of the standby mode operation, the control signal is at the operating voltage VDD and being lowered to the voltage VSS and being applied in one phase, and the operating voltage VSS is further decreased to the voltage VBB and being applied in another phase, the two phases being in a sequence during said single pull-down interval, to a gate of the NMOS switching FET.

6. A power saving circuit for metal oxide silicon field effect transistors (MOSFETS) comprising:

(a) an MOS circuit comprising low threshold voltage MOSFETs having thresholds which are so low that said low threshold voltage MOSFETs can exhibit subthreshold current leakage, (b) at least one MOSFET switch connected in series between the low threshold voltage MOSFETs and a corresponding one of a pair of operating voltages VDD and VSS, said at least one MOSFET switch being of low threshold voltage type similar to MOSFETs used in the MOS circuit, (c) means for applying at least one control signal to the at least one MOSFET switch for disabling, during a standby mode operation of the at least one MOSFET switch, the at least one control signal having a voltage of at least one of VPP and VBB, wherein VPP is more positive than the operating voltage VDD, and VBB is more negative than the operating voltage VSS, (d) wherein said at least one MOSFET switch comprises a single MOSFET switch connected between said MOS circuit and the operating voltage VDD and a resistor connected across a source and drain of the MOSFET switch, (e) the MOS circuit being comprised of a pair of complementary MOS (CMOS) FETS, and in which the MOSFET switch is connected between an PMOS FET of the pair of CMOS FETs and the operating voltage VDD, and (f) the MOSFET switch being a PMOS switching FET, and wherein during a pull-up interval of the standby mode operation, the control signal is at the operating voltage VSS and being raised to the operating voltage VDD and being applied in one phase, and the operating voltage VDD is further being raised to the voltage VPP and being applied in another phase, the two phases being in a sequence during said single pull-up interval, to a gate of the PMOS FET.

7. A power saving circuit for limiting subthreshold leakage current in a low threshold voltage $V_T$ MOS circuit comprising at least one MOSFET switch of a same low threshold voltage $V_T$ MOS type as in the low $V_T$ MOS circuit, connected between the low $V_T$ MOS circuit and at least one operating voltage of VDD and VSS, wherein the low $V_T$ of said at least one MOSFET switch is sufficiently low that subleakage current can be exhibited, means for applying control signal to the at least one low $V_T$ MOSFET switch with one of voltages more positive than the operating voltage VDD and more negative than the operating voltage VSS, for driving the at least one MOSFET switch further into its cutoff region than when the at least one MOSFET is driven with a normal logic level one of the operating voltages VDD and VSS wherein within a pull-up of a standby mode operation, the at least one MOSFET switch is driven into said further cut-off region via two phases, a first phase when the control signal is being raised from the operating voltage VSS to the operating voltage VDD and in a second phase the operating voltage VDD is further raised to VPP.

8. A method of operating an FET switch which is in series between an MOS integrated circuit and a respective one of the voltages VDD and VSS comprising the steps of, (a) in a first case, disabling said FET switch by applying a voltage to a control input of the FET switch which changes from VSS to approximately VDD in one phase and subsequently in a second phase from approximately VDD to a voltage VPP where VPP is more positive than the voltage VDD; or (b) in a second case, disabling said FET switch by applying to the control input of the FET switch from approximately VDD to VSS in one phase and subsequently in a second phase from said VSS to a voltage VBB where VBB is more negative than the voltage VSS.

9. A method as defined in claim 8 in which in the first case the FET switch is comprised of a PMOSFET having its source-drain circuit in series between the integrated circuit and the operating voltage VDD or in the second case the FET switch is comprised of an NMOS PET having its source-drain circuit in series between the integrated circuit and the operating voltage VSS.

10. A method as defined in claim 8 in which the FET switch is comprised, in the first case, of a PMOS FET and in the second case of an NMOS FET.

* * * * *